United States Patent
Tanaka et al.

(10) Patent No.: US 6,415,417 B1
(45) Date of Patent: Jul. 2, 2002

(54) METHOD AND APPARATUS FOR TRANSISTOR OPTIMIZATION, METHOD AND APPARATUS FOR LAYOUT DESIGN OF INTEGRATED CIRCUIT, AND INTEGRATED CIRCUIT

(75) Inventors: Masakazu Tanaka, Kyoto; Masahiro Fukui, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/516,779

(22) Filed: Mar. 1, 2000

(30) Foreign Application Priority Data

Mar. 1, 1999 (JP) ............................................. 11-052386

(51) Int. Cl.[7] .............................................. G06F 17/50

(52) U.S. Cl. ................................................ 716/2; 716/8

(58) Field of Search ....................... 716/1–21

(56) References Cited

U.S. PATENT DOCUMENTS

| | | | | |
|---|---|---|---|---|
| 5,675,501 A | * | 10/1997 | Aoki ............................. | 716/8 |
| 5,737,236 A | * | 4/1998 | Maziasz et al. ................ | 716/8 |
| 5,995,734 A | * | 11/1999 | Saika ............................. | 716/9 |
| 6,163,877 A | * | 12/2000 | Gupta ............................ | 716/8 |

FOREIGN PATENT DOCUMENTS

| | | | | |
|---|---|---|---|---|
| JP | 5-326705 | 12/1993 | ........... | H01L/21/82 |
| JP | 7-307448 | 11/1995 | ......... | H01L/27/118 |

OTHER PUBLICATIONS

Gupta et al. ("Optimal 2–D cell layout with integrated transistor folding", 1998 IEEE/ACM International Conference on Computer–Aided Design, Nov. 8, 1998, pp. 128–135).*

Kim et al., ("An Efficient Transistor Folding Algorithm for Row–based Cmos Layout Design", Proceedings of the 34th Design Automation Conference, Jun. 9, 1997, pp. 456–459).*

Gupta et al. ("XPRESS: a cell layout generator with integrated transistor folding", Proceedings of European Design and Test Conference, Mar. 11, 1996, pp. 393–400).*

Her et al. ("Cell area minimization by transistor folding", Proceedings of Design Automation Conference, Sep. 20, 1993, pp. 172–177).*

Hsich et al. ("LiB: a CMOS cell compiler", IEEE Transactons on Computer–Aided Design of Integrated Circuits and Systems, vol. 10, No. 8, Aug. 1991, pp. 994–1005).*

Li et al. ("Pull up transistor folding", IEEE Transactions on Computer–Aided Design of Integrated Circuits and Systems, vol. 9, No. 5, May 1990, pp. 512–521).*

Lursinsap et al. ("A technique for pull–up transistor folding", IEEE Transactions on Computer–Aided Design of Integrated Circuits and Systems, vol. 7, No. 8, Aug. 1988, pp. 887–896).*

(List continued on next page.)

Primary Examiner—Matthew Smith
Assistant Examiner—Phallaka Kik
(74) Attorney, Agent, or Firm—McDermott, Will & Emery

(57) ABSTRACT

In designing an integrated circuit, the size of a transistor is optimized together with the folding number thereof. The optimization of the size and folding number of the transistor is accomplished by using a folding model in which a plurality of folding numbers are assumed for one transistor size. In the folding model, if the lower limit value of the transistor size W is W0 and the height of a placement region for the transistor is H0, the folding number N can be determined arbitrarily so long as $W/H0 \leq N \leq W/W0$ is satisfied. If the size of the transistor is optimized together with the folding number thereof by using the folding model so long as a given design constraint is satisfied, there can be designed an integrated circuit which has been improved in terms of area and performance.

14 Claims, 6 Drawing Sheets

OTHER PUBLICATIONS van Genneken et al. ("Doubly folded transistor matrix layout", IEEE International Conference on Computer–Aided Design, Nov. 7, 1988, pp. 134–137).*

"TILOS: A Posynomial Programming Approach to Transistor Sizing", J.P. Fishburn et al., Proc. Int. Conf. on Computer–Aided Design, pp. 326–328, Jan. 1985.

"AESOP: A Tool for Automated Transistor Sizing", K.S. Hedlund, Proc. Design Automation Conf., pp. 114–120, Jan. 1987.

U.S. patent application Ser. No. 09/034,382, Tanaka et al. filed Mar. 4, 1998.

* cited by examiner

METHOD AND APPARATUS FOR TRANSISTOR OPTIMIZATION, METHOD AND APPARATUS FOR LAYOUT DESIGN OF INTEGRATED CIRCUIT, AND INTEGRATED CIRCUIT

BACKGROUND OF THE INVENTION

The present invention relates to a technique for optimizing a transistor in designing an integrated circuit.

To develop a high-performance, high-density integrated circuit, each individual library cell composing the integrated circuit should be optimized in terms of the performance and area thereof. In particular, the load capacitance, driving capability, and area of a transistor greatly affect the performance and area of the library cell so that a technique for optimizing the transistor has been increasing in importance.

As a conventional method for transistor optimization, there is one using a model wherein a transistor is modeled using a constant resistance and the diffusion capacitance and area thereof are proportional to the transistor size ("TILOS: A posynomial programming approach to transistor sizing" J. P. Fishburn et al, Proc. Int. Conf. on Computer-Aided Design, 1985, pp. 326–328). Another conventional method for transistor optimization uses a more precise nonlinear model of the operation of a transistor to achieve higher accuracy ("Aesop: A tool for automate transistor sizing" Proc. Design Automation Conf., 1985, pp. 114–120).
Problems to be Solved In an actual layout process, a transistor of a size larger than the height of a placement region is divided into a plurality of transistors which are connected in parallel and placed so that they share a diffusion region. This is termed "transistor folding" and a division number is termed a folding number (the number of folded portions). The area and diffusion capacitance of a transistor is affected by the folding.

In the conventional methods for transistor optimization, however, only the size of a transistor is the target of optimization and no consideration has not been given to the folding. The folding number is determined, during layout design, based on the transistor size determined without consideration of performance.

SUMMARY OF THE INVENTION

It is therefore an object of the present invention to provide a method for transistor optimization whereby the size of a transistor is optimized together with the folding number thereof.

Specifically, the present invention provides a method of optimizing, in designing an integrated circuit, a transistor composing the integrated circuit, the method comprising the step of optimizing a size and a folding number of the transistor so long as a given design constraint is satisfied by using a folding model in which a plurality of folding numbers are assumed for one transistor size.

In accordance with the invention, the size of the transistor is optimized together with the folding number thereof by using a folding model in which a plurality of folding numbers are assumed for one transistor size so long as the given design constraint is satisfied. Consequently, there can be designed an integrated circuit which has been improved in terms of area and performance.

In the method of optimizing a transistor in accordance with the present invention, an upper limit value of an area of the transistor is preferably given as the design constraint and an optimum combination of the size and the folding number that minimizes a delay so long as the area does not exceed the upper limit value is preferably determined. Moreover, the folding numbers in the folding model in the method of optimizing a transistor in accordance with the present invention are preferably assumed based on a lower limit value of the transistor size and on a height of a placement region for the transistor.

The present invention also provides a method of optimizing, in designing an integrated circuit, transistors composing the integrated circuit, the method comprising: a first step of calculating a performance improvement factor for each of the transistors when at least one of a size and a folding number of the transistor is changed; and a second step of selecting a type of the transistor change based on the calculated performance improvement factor and effecting the selected transistor change, the first and second steps being repeatedly performed to determine the size and folding number of the transistor.

In the method of optimizing a transistor in accordance with the present invention, the second step preferably includes selecting, as the type of the transistor change, a target transistor of changing and at least one of the size and folding number of the target transistor of changing. Alternatively, the second step in the method of optimizing a transistor in accordance with the present invention preferably includes selecting a type of the transistor change that maximizes the performance improvement factor. Alternatively, the second step in the method of optimizing a transistor in accordance with the present invention preferably includes calculating, for one of the transistors, the performance improvement factor when the size of the transistor is changed slightly for the same folding number and the performance improvement factor when the folding number is changed.

The present invention also provides a method of optimizing, in designing an integrated circuit, transistors composing the integrated circuit, the method comprising the steps of: obtaining a correlation curve between a delay and an area for each of a plurality of folding numbers of one of the transistors; obtaining a single postulated correlation curve for optimization based on the plurality of correlation curves obtained and on a common tangent to the individual correlation curves; and optimizing the size and folding number of the transistor in accordance with the correlation curve for optimization.

The present invention also provides a method for layout design of an integrated circuit, the method comprising the steps of: determining an optimum size of each of transistors together with an optimum folding number of the transistor based on a net list representing the integrated circuit and by using, as indices, performance of the integrated circuit and an area of the integrated circuit; and placing the transistor by using the size and folding number determined and generating a layout of the integrated circuit.

DETAILED DESCRIPTION OF THE INVENTION

Figure 1:
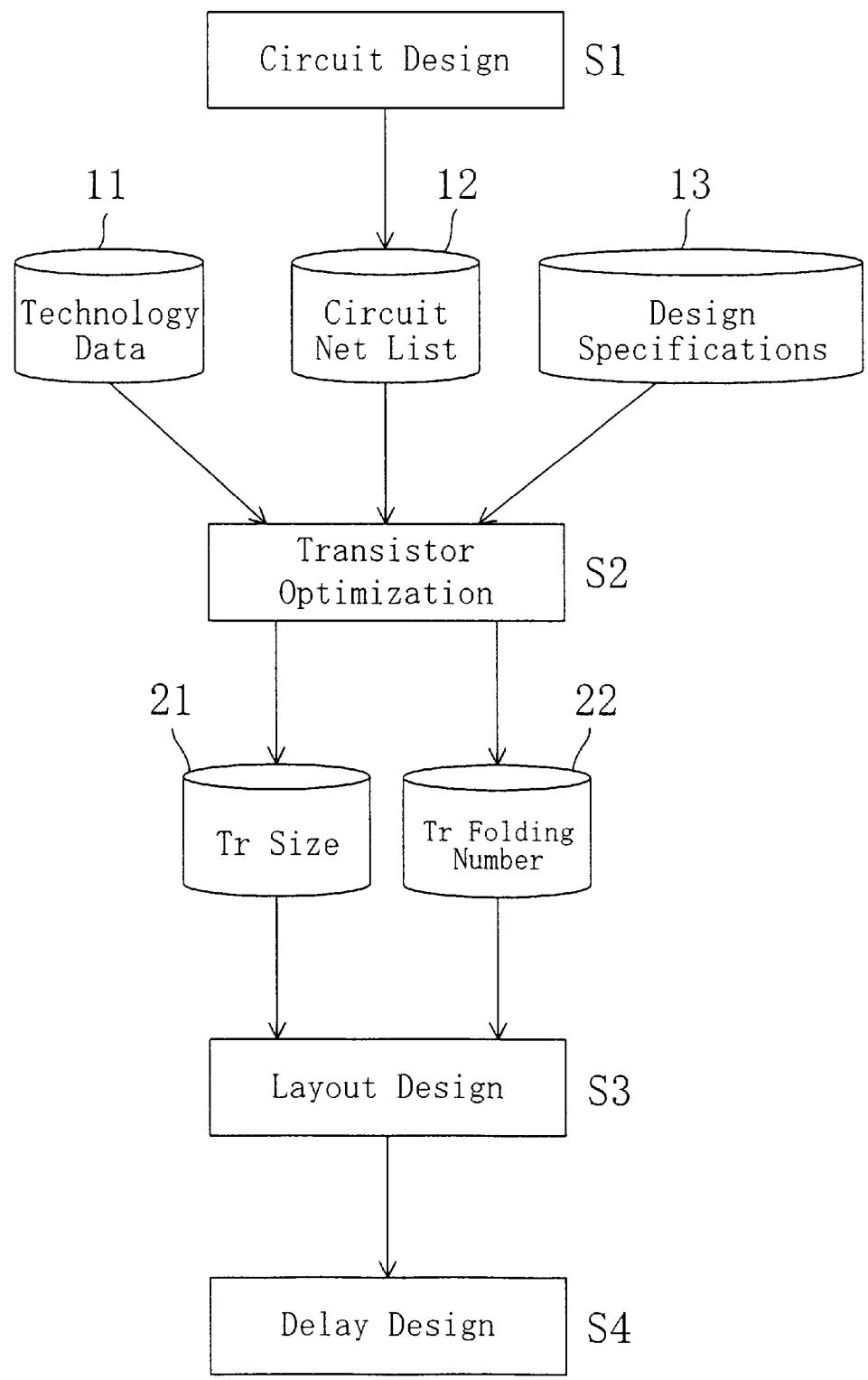
FIG. 1 shows a flow of library design according to an embodiment of the present invention.

Referring now to the drawings, an embodiment of the present invention will be described.

FIG. 1 shows a flow of library design according to the embodiment. In the present embodiment, a transistor size 21 is optimized together with a folding number 22 in a transistor optimizing step S2 based on technology data 11 including a design constraint, a circuit net list 12 such as SPICE, and design specifications 13 including the objective value of an area or delay and a cell height.

Folding Model

First, a description will be given to a transistor folding model in accordance with the present invention.

For a folded transistor to satisfy a design constraint, the transistor size W and the folding number N should satisfy the following numerical expression (1).

$$W0 \leq W/N \quad (1)$$

where the lower limit value of the transistor size which is permissible in terms of the design constraints is W0. On the other hand, if the height of a placement region for the transistor is H0, the following numerical expression (2) should be satisfied in order to place the transistor in the placement region.

$$W/H0 \leq N \quad (2)$$

From the numerical expressions (1) and (2), there can be derived $$W/H0 \leq N \leq W/W0 \quad (3).$$

The present invention is characterized in that the folding number N of the transistor can be set arbitrarily so long as the numerical expression (3) is satisfied.

Figure 2:
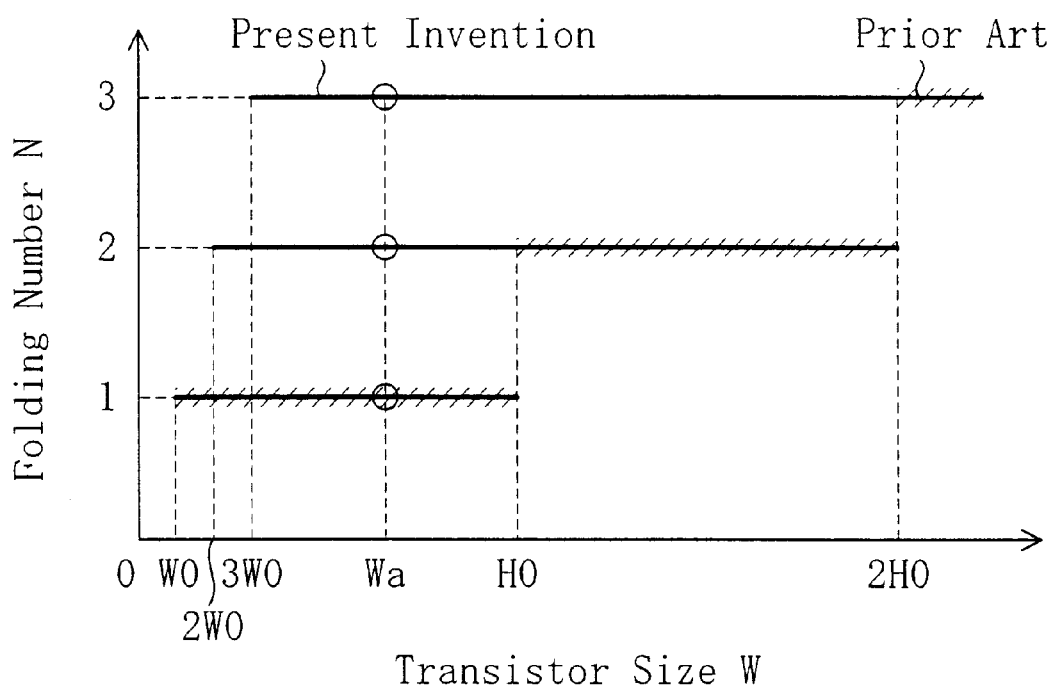
FIG. 2 is a graph representing a transistor folding model according to the embodiment.

FIG. 2 is a graph representing a transistor folding model in accordance with the present invention. The graph of FIG. 2 shows the relationship between transistor size W and the folding number N that can be set with the size W.

As can be seen from FIG. 2, the folding number N has conventionally been determined uniquely based on the transistor size W and the height H0 of the placement region (as indicated by the hatched portions in FIG. 2). Specifically, the folding number N has been determined in such a manner that the folding number N is 1 when the size W is between the minimum value W0 and the height H0 of the placement region, the folding number N is 2 when the size W is between H0 and 2H0, and the folding number N is 3 when the size W is between 2H0 and 3H0.

In the present invention, by contrast, the folding number N can be set freely so long as the numerical expression (3) is satisfied, as indicated by the solid lines in FIG. 2. For example, When the transistor size W is between 3W0 and the height H0 of the placement region (as indicated by Wa in FIG. 2), the folding number N can be set to any of 1, 2, and 3 in accordance with the present invention, while it has been determined to be 1 in accordance with the conventional embodiment. This allows more optimum setting of the folding number in terms of delay, area, and the like.

<Optimum Algorithm>

Based on the folding model described above, delay and area models are obtained. By using the delay and area models, the optimum size of each transistor and the optimum folding number thereof are determined.

Figure 3:
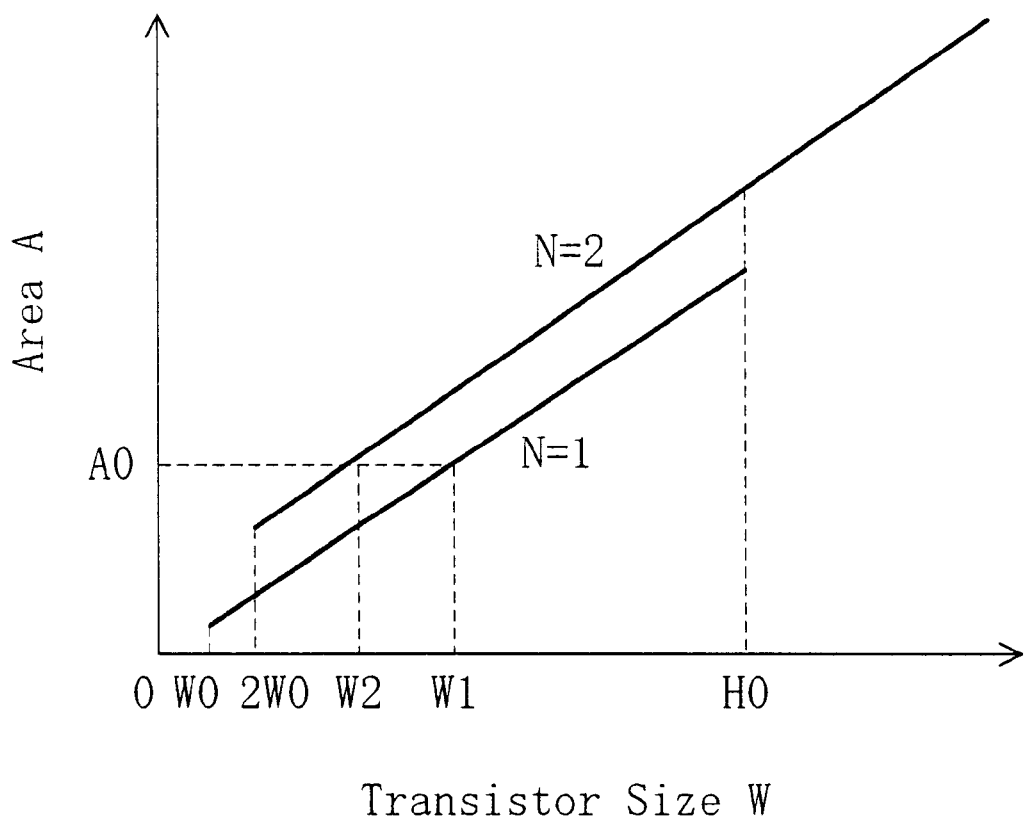
FIG. 3 is a graph representing delay and area models each obtained based on the folding model of FIG. 2, which shows the relations among the transistor size W, the folding number N, and the area A.
Figure 4:
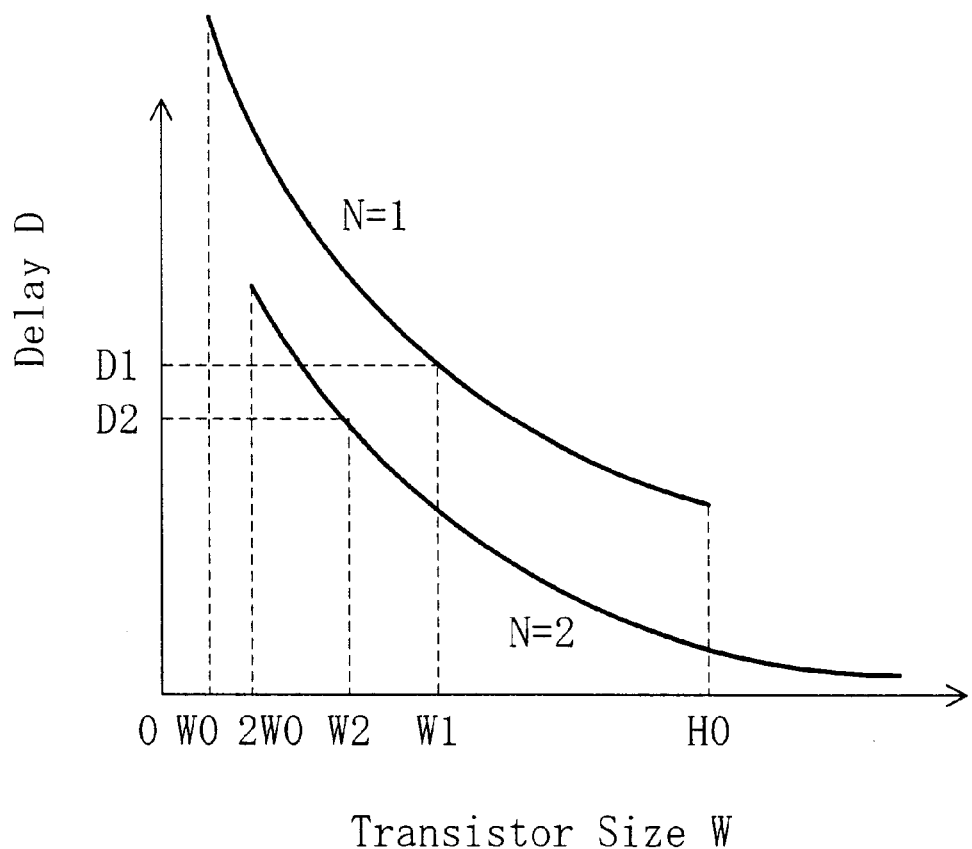
FIG. 4 is a graph representing the delay and area models obtained based on the folding model of FIG. 2, which shows the relations among the transistor size W, the folding number N, and the delay D.

FIGS. 3 and 4 are graphs showing delay and area models obtained based on the transistor folding model in accordance with the present invention. The graph of FIG. 3 shows the relations among the transistor size W, the folding number N, and the area A. The graph of FIG. 4 shows the relations among the transistor size W, the folding number N, and the delay D. The delay and area models shown in FIGS. 3 and 4 can be obtained by using a method disclosed in, e.g., Japanese Patent Publication No. 2872990 (corresponding to United States patent application Ser. No. 09/034382).

For example, it is assumed here that an area value A0 is given as an area constraint. In this case, there are two combinations (W1, 1) and (W2, 2) as the options of the size W and the folding number N. If it is assumed that the combination that minimizes the delay is selected, the combination (W2, 2) is selected since the delay D2 when the combination (W2, 2) is selected is smaller than the delay D1 when the combination (W1, 1) is selected. Thus, the present invention can provide an optimum solution that has not been obtainable conventionally. This allows a circuit layout with a reduced delay to be generated even if the same area constraint is imposed. Likewise, a circuit layout with a reduced area can be generated even if the same delay constraint is imposed.

In the case where the folding number is the same, the delay D presents the property of a convex function to the transistor size N. Specifically, if the ratio of a decrement in delay to an increment in area is defined as a performance improvement factor (−ΔD/ΔA), the performance improvement factor has the property of decreasing monotonously as the area A increases. On the other hand, both the delay and area change discontinuously when the folding number N is changed, since the folding number N is an integer.

Figure 5:
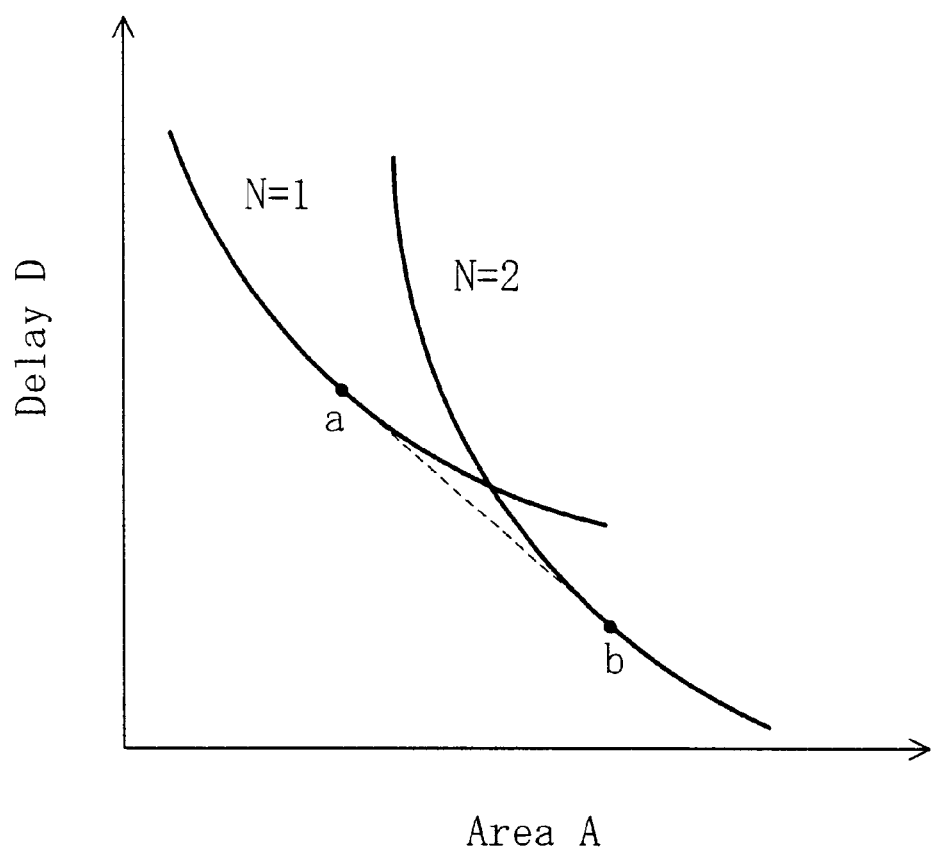
FIG. 5 is a graph showing the correlation between the area and delay of a transistor.

FIG. 5 is a graph showing the characteristics of the area and delay when the size and folding number of a certain transistor are changed. In FIG. 5, the size and folding number are more optimum as a point on the curves is at a lefter and lower position on the graph. When a delay constraint or an area constraint is given, therefore, the leftmost or lowermost point on the segments of the curves which fall within a range satisfying the delay constraint or area constraint may be obtained appropriately as an optimal solution.

The following is an optimization algorithm when a delay constraint value is given.

(step1) For each of the folding numbers, the delay and area are recorded while the transistor size is changed.

(step2) For each of the folding numbers, the individual recorded points are plotted on the graph and connected so that a delay-area correlation curve as shown in FIG. 5 is drawn.

(step3) The transistor size and folding number are obtained at the leftmost point on the segment of the delay-area correlation curve which falls within the range satisfying the delay constraint, i.e., the point at which the area is minimized. It is to be noted that the solution can also be obtained mathematically if the correlation between the delay and area is represented by a numerical expression.

In the case of determining the size and folding number of each of a plurality of transistors, the delay and area of the entire circuit can be minimized if the size and folding number of the transistor with a higher performance improvement factor are changed preferentially.

If a relationship as a convex function is established between the delay and area of each of the transistors, the delay and area of the entire circuit can be optimized by reducing the delay by increasing the area of the transistor with a higher performance improvement factor and by increasing the delay of the transistor with a lower performance improvement factor. If a change in the folding number N is considered, however, the relationship between the delay and area of each of the transistors is expressed as a combination of plural convex functions, as shown in FIG. 5, so that an optimization curve obtained by tracing the portions positioned on the left hand of or below the plural convex function curves does not assume a convex function, as shown in FIG. 5.

In accordance with the present invention, therefore, a common tangent such as the broken line a-b in FIG. 5 is added to the plural correlation curves on the graph and a single postulated correlation curve for optimization which assumes a convex function is produced so that optimization is performed. In FIG. 5, e.g., a size change is performed along the curve N=1 in the section where the area is smaller than at the point a, while a size change is performed along the curve N=2 in the section where the area is larger than at the point b. If the delay is to be made smaller than at the point a without obtaining a solution between the points a and b, the performance improvement factor when the size and folding number are changed at one stroke to the point b is evaluated. Likewise, if the area is to be made smaller than at the point b, the performance improvement factor when the size and folding number are changed at one stroke to the point b is evaluated. As a result of evaluating the performance improvement factor of each of the transistors, a target transistor of changing is determined.

The present embodiment combines the slight size change performed along the delay-area curve with the significant changes of the folding number N and the size W in the tangential direction and thereby performs optimization by regarding the delay-area correlation of the transistor as one convex function.

The following is the optimization algorithm according to the present embodiment.

(step1) The folding number N and size W of each transistor are initialized to 1 and W0, respectively.

(step2) The performance improvement factor is calculated for each transistor. The calculation is performed by repeatedly performing the following procedure of (step2-1) to (step2-3) for each transistor.

(step2-1) The performance improvement factor when the size W is slightly increased without changing the folding number N is calculated.

(step2-2) The maximum value of the performance improvement factor when the folding number N is increased so long as the area or delay does not exceed a constraint value is calculated.

(step2-3) A comparison is made between the two performance improvement factors and the higher one is designated as the performance improvement factor of the transistor.

(step3) The transistor with the maximum performance improvement factor is selected from all the transistors and the size W and folding number N of the selected transistor are changed.

(step4) The procedure of (step2) and (step3) is repeatedly performed till the delay of the integrated circuit satisfies the constraint value.

A description will be given to a method of determining the size and folding number of each of the transistors contained in the integrated circuit when initial values have been given to the size and folding number of the transistor.

(step1) An area change rate $\delta A/\delta W$ and a delay change rate $\delta D/\delta W$ for a certain transistor are obtained when the size of the transistor is slightly changed, while the folding number thereof is held at a specified value. The area change rate $\delta A/\delta W$ corresponds to the inclination of the lines on the graph of FIG. 3. The delay change rate $\delta D/\delta W$ corresponds to the inclination of the curves on the graph of FIG. 4.

(step2) The performance improvement factor defined by the following numerical expression is calculated.

Performance Improvement Factor=$-(\delta D/\delta W)/(\delta A/\delta W)$

A higher performance improvement factor indicates that the delay can be reduced significantly by slightly increasing the area or that the area can be reduced significantly by slightly increasing the delay.

(step3) The performance improvement factor of the transistor is calculated similarly by changing the folding number without changing the area. Of the performance improvement factors calculated for the individual folding numbers, the maximum one is designated as the performance improvement factor of the transistor.

(step4) The procedure of (step1) to (step3) is performed for all the transistors to calculate the respective performance improvement factors thereof.

(step5) The respective performance improvement factors of the individual transistors are compared with each other and the transistor with the maximum performance improvement factor and the transistor with the minimum performance improvement factor are selected.

(step6) A comparison is made between the given delay constraint and the current delay of the integrated circuit to change the setting of the transistor selected in (step5) as follows.

(step6-1) When the delay of the integrated circuit is smaller than the constraint value, the delay of the transistor with the maximum performance improvement factor is increased slightly.

(step6-2) When the delay of the integrated circuit is longer than the constraint value, the delay of the transistor with the minimum performance improvement factor is decreased slightly.

(step6-3) When the delay of the integrated circuit is equal to the constraint value, the area of the transistor with the maximum performance improvement factor is increased slightly and the area of the transistor with the minimum performance improvement factor is decreased slightly by an amount equal to the increment.

(step7) The procedure of (step1) to (step6) is repeatedly performed till the respective performance improvement factors of all the transistors become equal. The procedure is completed when the performance improvement factors of all the transistors become equal.

Such an algorithm allows the minimization of the area of an integrated circuit under the delay constraint. Although the present embodiment has shown, by way of example, the case where the area is minimized when the delay constraint is given, it is also possible to minimize the delay of the integrated circuit under an area constraint by switching the area and the delay.

Figure 6:
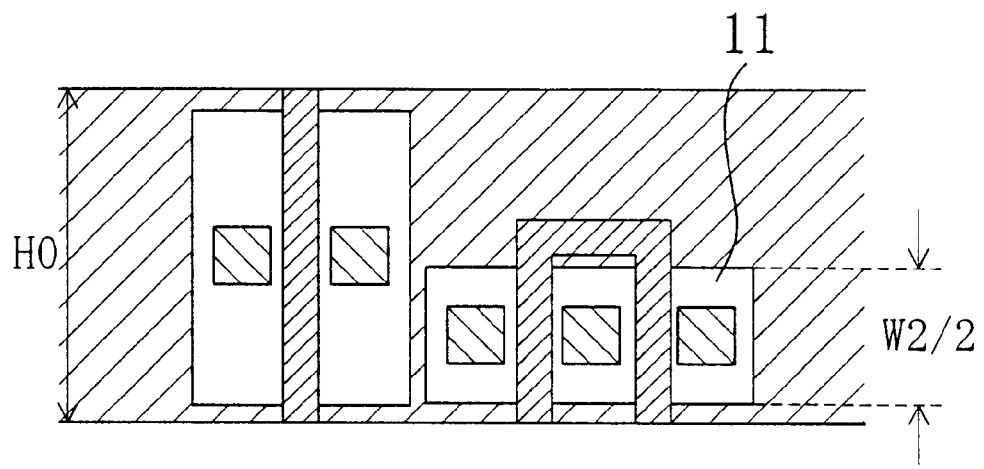
FIG. 6 shows an example of the layout of an integrated circuit obtained according to the embodiment.

FIG. 6 shows an example of the layout of the integrated circuit obtained according to the present embodiment. In FIG. 6, (W2, 2) has been determined to be the optimum combination of the size W and folding number N of a transistor 11. Since the size W2 of the transistor 11 is smaller than the height H0 of the placement region, the transistor 11 can be placed without being subjected to folding. However, the transistor 11 has been intentionally subjected to folding and placed as a result of implementing the optimization algorithm according to the present embodiment.

Even when another index such as power consumption is used instead of delay for optimization, optimization can similarly be accomplished by using the relations among the size W, the folding number N, and the other index such as power consumption.

The method for transistor optimization and the method for layout design according to the present invention can be implemented by using an apparatus comprising a computer for executing programs for implementing the methods. Alternatively, it is also possible to record the programs for implementing the methods on a computer readable recording medium and causing the computer to execute the programs recorded on the recording medium.

Thus, in accordance with the present invention, the size of the transistor can be optimized together with the folding number thereof, which allows the design of an integrated circuit that is more excellent in terms of area and performance.

What is claimed is:

1. A method of optimizing, in designing an integrated circuit, a transistor composing the integrated circuit, the method comprising the step of:
    optimizing a size and a folding number of the transistor so long as a given design constraint is satisfied by using a folding model in which a plurality of folding numbers are assumed for one transistor size.

2. The method of claim 1, wherein the optimizing step comprises the steps of:
    giving an upper limit value of an. area of the transistor as the design constraint; and
    determining an optimum combination of the size and the folding number that minimizes a delay so long as the area does not exceed the upper limit value.

3. The method of claim 1, wherein the folding numbers in the folding model are assumed based on a lower limit value of the transistor size and on a height of a placement region for the transistor.

4. An integrated circuit having a transistor of which a size and a folding number have been optimized in accordance with a method of optimizing a transistor as recited in claim 1.

5. A method of optimizing, in designing an integrated circuit, transistors composing the integrated circuit, the method comprising:
    a first step of calculating a performance improvement factor for each of the transistors when at least one of a size and a folding number of the transistor is changed; and
    a second step of selecting a type of the transistor change based on the calculated performance improvement factor and effecting the selected transistor change,
    repeatedly performing the first and second steps to determine the size and folding number of the transistor.

6. The method of claim 5, wherein the second step includes selecting as the type of the transistor change, a target transistor of changing and at least one of the size and folding number of the target transistor of changing.

7. The method of claim 5, wherein the second step includes selecting a type of the transistor change that maximizes the performance improvement factor.

8. The method of claim 5, wherein the first step includes calculating, for one of the transistors, the performance improvement factor when the size of the transistor is changed slightly for the same folding number and the performance improvement factor when the folding number is changed.

9. A method of optimizing, in designing an integrated circuit, transistors composing the integrated circuit, the method comprising the steps of:
    obtaining a correlation curve between a delay and an area for each of a plurality of folding numbers of one of the transistors;
    obtaining a single postulated correlation curve for optimization based on the plurality of correlation curves obtained and on a common tangent to the individual correlation curves; and
    optimizing the size and folding number of the transistor in accordance with the correlation curve for optimization.

10. A method for layout design of an integrated circuit, the method comprising the steps of:
    determining an optimum size of each of transistors together with an optimum folding number of each of the transistors based on a net list representing the integrated circuit and by using, as indices, performance of the integrated circuit and an area of the integrated circuit; and
    placing each transistor by using the size and folding number determined and generating a layout of the integrated circuit.

11. An apparatus for optimizing, in designing an integrated circuit, a transistor composing the integrated circuit, the apparatus comprising:
    means for optimizing a size and a folding number of the transistor so long as a given design constraint is satisfied by using a folding model in which a plurality of folding numbers are assumed for one transistor size.

12. A recording medium having thereon a program for causing a computer to optimize, in designing an integrated circuit, a transistor composing the integrated circuit, the program performing the function of causing the computer to perform:
    a procedure of optimizing a size and a folding number of the transistor so long as a given design constraint is satisfied by using a folding model in which a plurality of folding numbers are assumed for one transistor size.

13. An apparatus for layout design of an integrated circuit, the apparatus comprising:
    means for determining an optimum size of each of transistors together with an optimum folding number of each of the transistors based on a net list representing the integrated circuit and by using, as indices, performance of the integrated circuit and an area of the integrated circuit; and
    means for placing each transistor by using the size and folding number determined and generating a layout of the integrated circuit.

14. A recording medium having thereon a program for causing a computer to perform layout design of an integrated circuit, the program performing the function of causing the computer to perform:
    a procedure of determining an optimum size of each of transistors together with an optimum folding number of each of the transistors based on a net list representing the integrated circuit and by using, as indices, performance of the integrated circuit and an area of the integrated circuit; and
    a procedure of placing each transistor by using the size and folding number determined and generating a layout of the integrated circuit.

* * * * *